US005274234A

United States Patent [19]

Garcia et al.

[11] Patent Number: 5,274,234

[45] Date of Patent: Dec. 28, 1993

[54] REALIZATION OF AN ATOMIC SOURCE OF METALLIC IONS PRODUCING A SURFACE MELTING BY AN APPLIED ELECTRIC FIELD

[75] Inventors: Nicolas G. Garcia, Madrid, Spain; Vu T. Binh, Villeurbanne, France

[73] Assignee: Universidad Autonoma de Madrid, Madrid, Spain

[21] Appl. No.: 855,953

[22] Filed: Mar. 23, 1992

[30] Foreign Application Priority Data

Mar. 22, 1991 [ES] Spain .................................. 9100740

[51] Int. Cl.[5] .............................................. H01J 37/30

[52] U.S. Cl. ................................ 250/307; 250/423 F; 250/492.2

[58] Field of Search .................... 250/306, 307, 423 F, 250/423 R, 492.2

[56] References Cited

U.S. PATENT DOCUMENTS

| | | | |
|---|---|---|---|
| 3,864,572 | 2/1975 | Van Der Mast et al. | 250/423 F |
| 4,954,711 | 9/1990 | Fink et al. | 250/423 F |
| 5,038,034 | 8/1991 | Fujita | 250/423 F |
| 5,043,578 | 8/1991 | Gëthner et al. | 250/307 |

*Primary Examiner*—Bruce C. Anderson
*Attorney, Agent, or Firm*—Kirschstein et al.

[57] ABSTRACT

An electric field having a strength of approximately 15 V/nm is applied between a tungsten tip and a metallic substrate. Concomitantly, the tip is heated to a temperature less than the bulk melting temperature of the tungsten tip. Atoms at the surface of the tip move and form a pyramidal protrusion of nanometer scale on the tip. Topmost atoms on the protrusion are charged and form a coherent beam useful for writing atomic scale structures on the substrate.

2 Claims, 3 Drawing Sheets

REALIZATION OF AN ATOMIC SOURCE OF METALLIC IONS PRODUCING A SURFACE MELTING BY AN APPLIED ELECTRIC FIELD

BACKGROUND OF THE INVENTION

The possibility of obtaining sources of metallic ions of atomic dimensions has been investigated by E. W. Mueller and T. T. Tsong. Progress in Surface Science, Vol. 1, pag. 1 (1974) but its physical realization has not been possible up to now. When a large electric field (a few tens of volt per nanometer) is applied to a metallic surface the phenomena of metallic ion evaporation by field is observed. However at low temperatures (liquid nitrogen (LN)) the number of emitted ions is very small due to the fact that the surface diffusion is small and the beam although originated in a single atomic site is not useful. If the temperature is increased too much the ions come out from many sites and the beam is not coherent and not focussed. At higher temperatures, near to the bulk temperature of melting of the material, the metal became liquid and a beam of ions of macroscopic dimensions can be obtained, with the characteristics of a hydrodynamic fluid. This is the basis of the beams used now a days and are known as Taylor cones (G. I. Taylor, Proc. Roy. Soc. London A313, 453, (1969)).

SUMMARY OF THE INVENTION

The present invention relates to the observation of two phenomena with important technological repercussions. First it is shown that by an applied electric field to a metal it is possible to obtain a liquid of the last layer of atoms of the surface at temperatures much lower that the bulk melting temperature. This implies that instead of having a three dimensional fluid we have a one dimensional liquid outer layer of atoms. At the same time protusions are formed and are cooled down. By changing the field polarity of the applied electric field it is obtained a focussed and coherent electron beam. This can be used as a electron gun of high brightness and stability in an electron microscope. The procedure for this is the field electron emission.

DETAILED DESCRIPTION OF THE PREFERRED EMBODIMENT

Figure 1:
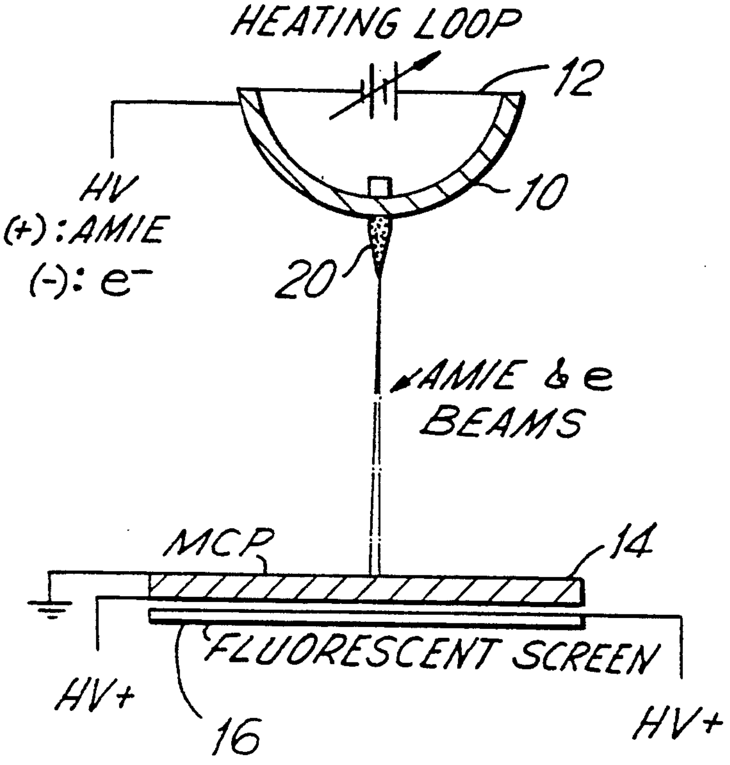
FIG. 1 is an electrical schematic for performing the instant invention.
Figure 2:
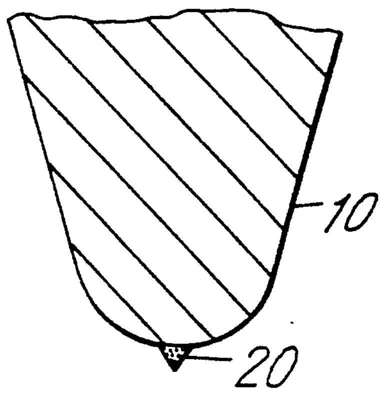
FIG. 2 is an enlarged view of the tip formed during use of the invention.
Figure 3:
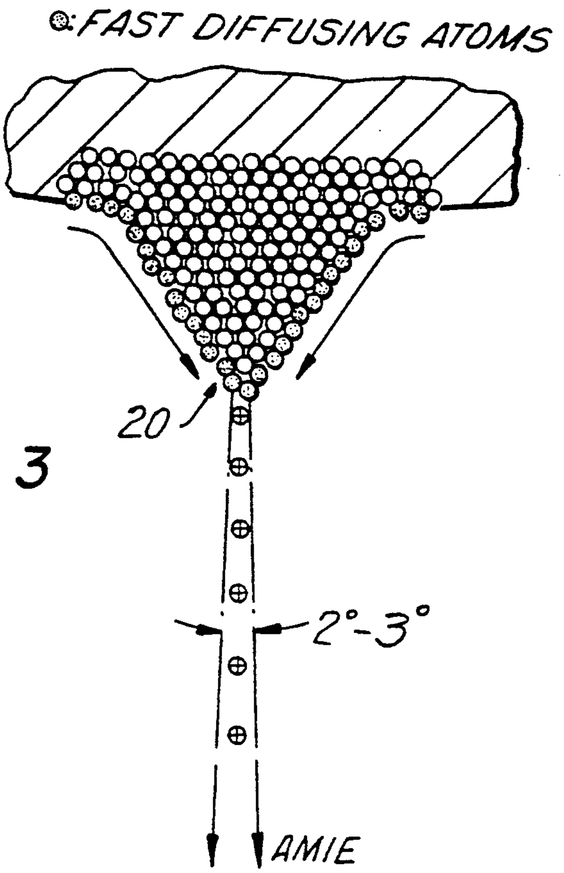
FIG. 3 is an enlarged view showing an ion beam emitted from the tip of FIG. 2.
Figure 4:
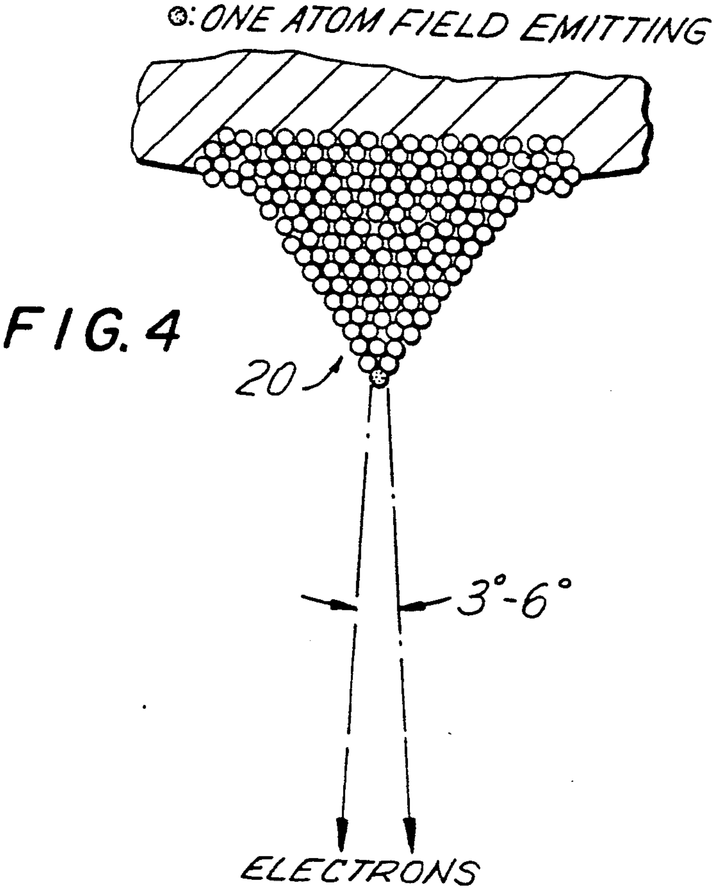
FIG. 4 is an enlarged view showing an electron beam emitted from the tip of FIG. 2.
Figure 5A:
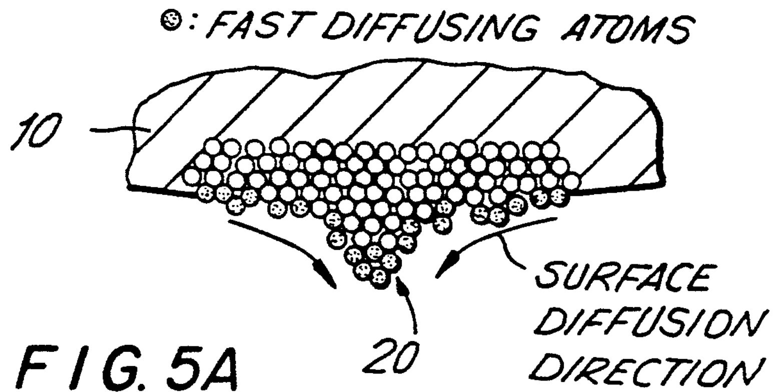
FIG. 5 is a series of enlarged views showing the formation of the tip of FIG. 2.
Figure 5B:
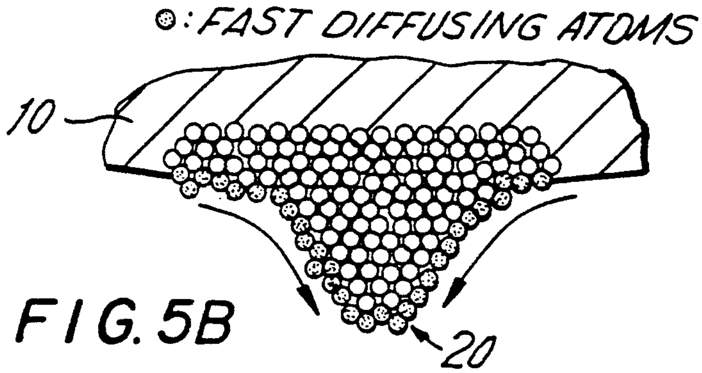
Figure 5C:
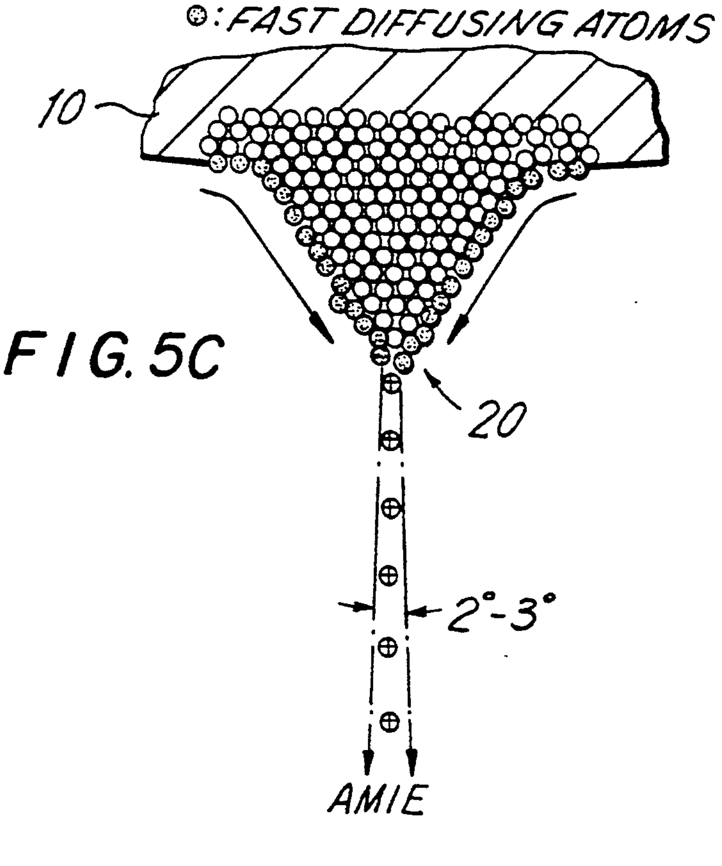

In this invention we prove and have verified experimentally the points described previously. The experiments have been performed in the setup of FIG. 1 in a field emission microscope that it is coupled to a field ion microscope. It has been carried out to control all parameters in ultrahigh vacuum at $10^{-11}$ Torr. The microscope images are taken at LN to have atomic resolution. The system used is a tungsten (W) tip 10 obtained from a fine W wire. The reason to use this tip of approximately 100 nm radius is to have the field necessary for the functioning of the device. To sharpen the tip to form protrusions 20 we use the technique known as thermal sharpening in ultra high vacuum, rising the temperature up to 3000K, as it is done by Vu Thien Binh, J. Microscopy 152, 355 (1988). To obtain the desired temperature in the experiment, once the tip is sharpened, it is heated in a Joule loop 12. The emission of ions is visualized by means of a channel plate 14 coupled to a flourescent screen 16. The images are registered in a video camera that permits the ulterior image treatment.

EXAMPLE

Once we have prepared a well clean W tip, we proceed by scanning the physical parameters of field and temperature. Notice that temperature increases the diffusion in all the metallic body conforming the tip, while the electric field only does that at the surfaces because it is screened in the surface layer of atoms. It is found that at 1500K and for a field of 12 to 15 V/nm in the fluorescent screen bright points appear when the field polarity is to extract ions. It is observed a beam of ions focussed to 3° and with a current of approximately $10^5$ ions/second. This implies that the surface is melted because to keep the beam in time atoms have to diffuse to the surface with a least a surface diffusion coefficient of $10^{-5}$ $cm^2$/second. This is the indication of surface melting. The interesting thing is that only the last layer of surface atoms can be melted because the applied electric field can not penetrate in the surface sublayers. The experiments have been repeated many times and are completely reproducible. The phenomena also takes place with gold tips and should be applicable to other metals.

We claim:

1. A method of writing atomic scale structures on a metallic substrate, comprising the steps of:

(a) positioning a tip constituted of a metallic material at a distance from the metallic substrate, said tip having a radius no greater than 100 nanometers;

(b) applying an electric field of strength greater than 1 V/nm between the tip and substrate, and concomitantly heating the tip to a temperature less than the bulk melting temperature of the tip material to cause atoms at the surface of the tip to move and form a pyramidal protrusion of nanometer scale on the tip; and (c) increasing the field strength until a topmost atom on the protrusion is charged, thereby forming a coherent writing beam of charged particles.

2. The method according to claim 1, wherein the tip material is tungsten, and wherein the heating step is performed at about 1500° K., and wherein the applying step is performed at about 12-15 v/nm.

* * * * *